(12) United States Patent
Miyazawa et al.

(10) Patent No.: US 9,111,886 B2
(45) Date of Patent: Aug. 18, 2015

(54) METHOD OF REPAIRING A DEFECT OF AN ORGANIC EL DISPLAY

(75) Inventors: Kazutoshi Miyazawa, Osaka (JP); Yutaka Kuriya, Osaka (JP)

(73) Assignee: JOLED INC., Tokyo (JP)

( * ) Notice: Subject to any disclaimer, the term of this patent is extended or adjusted under 35 U.S.C. 154(b) by 306 days.

(21) Appl. No.: 13/142,889

(22) PCT Filed: Feb. 1, 2010

(86) PCT No.: PCT/JP2010/000586
§ 371 (c)(1),
(2), (4) Date: Jun. 30, 2011

(87) PCT Pub. No.: WO2010/092765
PCT Pub. Date: Aug. 19, 2010

(65) Prior Publication Data
US 2011/0287682 A1 Nov. 24, 2011

(30) Foreign Application Priority Data
Feb. 10, 2009 (JP) .................. 2009-028436

(51) Int. Cl.
*H01L 51/56* (2006.01)
*H01L 27/32* (2006.01)
*H01L 51/00* (2006.01)

(52) U.S. Cl.
CPC ........ *H01L 27/3246* (2013.01); *H01L 27/3283* (2013.01); *H01L 51/0005* (2013.01); *H01L 2251/568* (2013.01)

(58) Field of Classification Search
CPC ............ H01L 27/3246; H01L 27/3283; H01L 2251/568; H01L 27/28; H01L 51/0005; H01L 31/18; H01L 51/0001; H01L 21/64; H01L 21/20241; H01L 2221/67; H01L 51/56; H01L 22/20; G03F 3/00

USPC ......... 445/2; 313/498–512; 315/169.1, 169.3; 428/690–691, 917; 438/26–29, 34, 82; 427/66, 532–535, 539; 257/40, 72, 257/98–100, 642–643, 759
See application file for complete search history.

(56) References Cited

U.S. PATENT DOCUMENTS 4,478,590 A * 10/1984 Rychlewski .................. 264/618
4,960,611 A * 10/1990 Fujisawa et al. .............. 427/504

(Continued)

FOREIGN PATENT DOCUMENTS

CN 101158776 A * 4/2008
JP 2003-178871 * 6/2003

(Continued)

OTHER PUBLICATIONS

International Search Report for PCT/JP2010/000586 dated May 11, 2010.

(Continued)

*Primary Examiner* — Anh Mai
*Assistant Examiner* — Fatima Farokhrooz
(74) *Attorney, Agent, or Firm* — Pearne & Gordon LLP

(57) ABSTRACT

The disclosed method is for manufacturing organic EL displays that comprise a substrate and multiple organic EL elements that are disposed in a matrix form on said substrate, and wherein said organic EL elements comprise pixel electrodes that are disposed on said substrate, an organic layer that is disposed on said pixel electrodes and a counter-electrode that is disposed on said organic layer. The organic EL display manufacturing method comprises a step for forming banks that delineate the organic layer on the substrate, a step for coating the region delineated by said banks with a solution comprising an organic material and forming the organic layer, a step for detecting defectively formed portions of said organic layer, a step for removing said defectively formed portions, a step for forming a recessed part or a protruding part around the region from which said poorly formed portion has been removed, and a step for re-coating the region from which said defectively formed portion was removed with the solution comprising the organic material.

11 Claims, 10 Drawing Sheets

(56) References Cited

U.S. PATENT DOCUMENTS

| | | | |
|---|---|---|---|
| 5,246,804 A * | 9/1993 | Furukawa et al. | 430/20 |
| 5,922,399 A * | 7/1999 | Kobayashi | 427/140 |
| 6,589,801 B1 * | 7/2003 | Yoon et al. | 438/15 |
| 7,913,642 B2 * | 3/2011 | O'Connor et al. | 118/246 |
| 2002/0001026 A1 | 1/2002 | Ishikawa et al. | |
| 2002/0164537 A1 * | 11/2002 | Imahara et al. | 430/199 |
| 2003/0011304 A1 | 1/2003 | Duineveld et al. | |
| 2003/0054186 A1 | 3/2003 | Miyashita et al. | |
| 2004/0191408 A1 | 9/2004 | Okada et al. | |
| 2005/0153213 A1 * | 7/2005 | Schulze et al. | 430/5 |
| 2006/0285055 A1 * | 12/2006 | Tanaka | 349/153 |
| 2007/0273276 A1 * | 11/2007 | Ottermann et al. | 313/505 |
| 2008/0107823 A1 | 5/2008 | Morii et al. | |
| 2008/0107970 A1 * | 5/2008 | Tanabe et al. | 430/5 |

FOREIGN PATENT DOCUMENTS

| | | |
|---|---|---|
| JP | 2003-257652 A | 9/2003 |
| JP | 2004-119243 A | 4/2004 |
| JP | 2004-226424 A | 8/2004 |
| JP | 2004-527088 A | 9/2004 |
| JP | 2006-310266 A | 11/2006 |
| JP | 2007-073316 A | 3/2007 |
| JP | 2007-101809 A | 4/2007 |
| JP | 2007-291377 A | 11/2007 |

OTHER PUBLICATIONS

Chinese Search Report for Application No. 201080006807.6 dated May 5, 2014.

* cited by examiner

METHOD OF REPAIRING A DEFECT OF AN ORGANIC EL DISPLAY

TECHNICAL FIELD

The present invention relates to a method of manufacturing an organic EL display.

BACKGROUND ART

Recently, organic EL displays have attracted attention as the next-generation flat display panels. The organic EL displays have such advantages as self-luminescence, wide viewing angle, high-contrast image, thin profile, lightweight, and low power consumption.

Each of the organic EL devices that constitute an organic EL display generally includes a pixel electrode, a counter electrode, and an organic layer arranged between the pixel electrode and counter electrode. The organic layer is composed of a light-emitting layer containing fluorescent molecules, and an electron conductive thin film and a hole conductive which sandwich the light-emitting layer. Application of voltage between the pixel electrode and the counter electrode results in injection of electrons into the electron conductive thin film from the counter electrode and injection of holes into the hole conductive thin film from the pixel electrode, with the result that the electrons and holes are recombined in the light-emitting layer to cause luminescence.

In the manufacture of an organic EL display, the formation of an organic layer laminate is a critical process because the status of the organic layers has a great effect on the luminous efficiency and power consumption of the organic EL display. Methods of forming organic layers are broadly classified into two groups according to whether low-molecular or polymer material is chosen as organic material.

In the case of low-molecular organic materials, an organic layer laminate can be generally formed by vapor deposition. In this process, a substrate and a low-molecular material are placed in a vacuum chamber in the first place. After placing the chamber under vacuum, the low-molecular material is evaporated by electric resistance heating onto the substrate to form thereon an organic layer. By repeating this vapor deposition process for each different organic material, an organic layer laminate can be formed.

In the case of polymer organic materials, on the other hand, an organic layer laminate can be formed by coating methods. A solution of polymer organic material is applied (printed) by inkjet printing or the like on necessary areas and dried to form an organic layer. By repeating the cycle of coating and drying for each different organic material, an organic layer laminate can be formed (see, e.g., Patent Literatures 1 to 5).

In recent years large-screen displays have been required. The development of large-screen organic EL displays is also underway. As described above, the formation methods of organic layers are broadly classified into two groups according to the type of organic material used. In terms of manufacture of large-screen displays, however, coating methods are advantageous over vapor deposition for the reasons described below.

In the case where vapor deposition is employed upon formation of organic layers, because the type of organic material which constitutes a light-emitting layer varies from one luminescent color to another, different organic materials need to be deposited for different luminescent colors. In order to deposit organic materials in place according to the luminescent color, a metallic mask is generally used to mask those areas on which organic materials are not to be deposited.

However, the larger the size of an organic EL display to be manufactured, the more it becomes difficult for the metallic mask to achieve precise masking due, for example, to its dimensional accuracy or deformation caused by thermal expansion during vapor deposition. On the other hand, in the case where organic layers are formed by coating methods, it is possible to apply a solution of organic material in proper areas without having to mask unwanted areas with a metallic mask. Thus, since coating methods eliminate the need to use a mask, they are advantageous methods of forming organic layers during the manufacture of a large-screen display.

When forming organic layers by coating methods such as inkjet printing, a solution of organic material needs to be applied in such a way that a uniform thickness is achieved across the entire surface of the substrate. In some cases, it is difficult to apply a solution of organic material at a uniform thickness across the entire surface of the substrate. Inkjet printing, for example, may not be able to achieve uniform application of coating solution over the substrate surface due, for example, to unstable ejection from nozzles or nozzle clogging. Moreover, when foreign material is present on the surface to be coated, there is a possibility of failing to uniformly apply the solution at a desired thickness, even when ejection from nozzles is stable. In such cases, a uniform thickness cannot be ensured over the substrate surface, resulting in film thickness variation over the substrate surface. In some cases, uncoated areas may occur. The presence of such defects in the organic layers causes brightness variation and/or creates non-luminescent portions when the display is illuminated. This eventually leads to low manufacturing yields of organic EL displays.

In order to solve the foregoing problem, methods of repairing defects in organic layers have been proposed (see, e.g., Patent Literature 6). Patent Literature 6 discloses a method of repairing defects in organic layers which are formed by inkjet printing. In this method, organic layers are checked for a defect, and the detected defect is dissolved away by application of a solvent. Subsequently, a solution of organic material is selectively applied to the region from which the defect has been dissolved away, to reproduce an organic layer therein.

The method disclosed by Patent Literature 6, however, has a drawback that it cannot repair those defects whose thickness is greater than that of the surrounding organic layer (convex defect; see FIG. 3C). That is, a defect to be repaired with the method disclosed by Patent Literature 6 should be thinner than the surrounding normal areas so that the solvent applied does not spread over the normal areas.

Moreover, the method disclosed by Patent Literature 6 has a drawback that it is difficult to control the amount of coating solution to be re-applied to an appropriate level. That is, in the method disclosed by Patent literature 6, the amount of coating solution to be re-applied increases with increasing defect size, and decreases with decreasing defect size. Thus, because the amount of coating solution to be re-applied greatly varies depending on the defect size, it is difficult with this method to control the amount of coating solution to an appropriate level; therefore, complete defect repair may fail.

A technology that succeeded in overcoming such a problem is described in Patent Literature 7. Patent Literature 7 discloses a defect repair method which includes the steps of: removing a defect, a region contaminated with foreign material or the like; and re-applying a solution of organic material in the region from which the defect has been removed. Since a defect repair method such as that disclosed by Patent Literature 7 involves ablation of a defect, the method can repair those types of defects whose thickness is greater than that of the surrounding area. Moreover, with such a defect repair method, it is only necessary to determine the amount of coating solution to be re-applied according to the amount of the organic layer ablated, making it possible to control the amount of the coating solution to an appropriate level.

CITATION LIST

Patent Literature

[PTL 1] Japanese Patent Application Laid-Open No. 2003-257652
[PTL 2] U.S. Patent Application Publication No. 2002/0001026
[PTL 3] U.S. Patent Application Publication No. 2003/0054186
[PTL 4] U.S. Patent Application Publication No. 2004/0191408
[PTL 5] U.S. Patent Application Publication No. 2008/0107823
[PTL 6] Japanese Patent Application Laid-Open No. 2007-73316
[PTL 7] Japanese Patent Application Laid-Open No. 2004-119243

SUMMARY OF INVENTION

Technical Problem

The method disclosed by Patent Literature 7, however, has a drawback that when a solution of organic material is re-applied in the region from which a defect has been removed, the solution spreads over non-defective areas of the organic layer. The method disclosed by Patent Literature 7 will be described below with reference to the drawings.

FIGS. 1A and 1B illustrate a part of the defect repair method described in Patent Literature 7. As illustrated in FIG. 1A, with the method disclosed by Patent Literature 7, a defect of an organic layer, a region contaminated with foreign material or the like, is ablated by laser irradiation or other method to form ablated portion 140.

Solution 150 containing organic material is then re-applied in ablated portion 140 to reproduce an organic layer therein (see FIG. 1B). Reproduction of an organic layer of a given thickness requires that a large amount of solution 150 be applied in ablated portion 140. For this reason, solution 150 may overflow from ablated portion 140 of the organic layer to spread over the surrounding normal areas. In particular, when the defect and, therefore, ablated portion 140 are small, solution 150 spreads significantly.

FIGS. 2A and 2B illustrate that solution 150 applied in ablated portion 140 spreads over other areas than ablated portion 140. FIG. 2A is a perspective view, and FIG. 2B is a sectional view. As illustrated in FIGS. 2A and 2B, when solution 150 spreads over normal areas of organic layer 110, organic layer 110 has a non-uniform thickness. Non-uniform organic layer thickness leads to poor product quality and low manufacturing yields.

It is therefore an object of the present invention to provide a method of manufacturing an organic EL display, wherein even when a solution of organic material is re-applied in an ablated portion of an organic layer, the ablated portion being formed by removing a defect of the organic layer, the solution does not spread from the ablated portion to other areas.

Solution to Problem

The inventor established that the foregoing problem can be overcome by providing depressions or protrusions around an ablated portion of an organic layer. With additional studies, the inventor completed the present invention.

Specifically, the present invention relates to methods of manufacturing an organic EL display given below.

[1] A method of manufacturing an organic EL display, the organic EL display including a substrate and a plurality of organic EL devices disposed on the substrate in a matrix pattern, the method including:

forming on the substrate banks for defining an organic layer;

applying a solution of organic material in a region defined by the banks, to form the organic layer;

detecting a defect of the organic layer;

removing the defect;

forming a depression or a protrusion around a region from which the defect has been removed; and applying the solution of organic material in the region from which the defect has been removed.

[2] The manufacturing method according to [1], wherein the defect is removed by laser irradiation.

[3] The manufacturing method according to [1] or [2], wherein an inkjet printer, a dispenser or a coating needle is used to apply the solution of organic material in the region from which the defect has been removed.

[4] The manufacturing method according to [1] or [2], wherein a fine droplet transfer device is used to apply the solution of organic material in the region from which the defect has been removed.

[5] The manufacturing method according to [4], wherein the fine droplet transfer device includes a solution container tube for containing therein the solution of organic material, and a transfer pin configured to be capable of passing through the solution container tube, the solution of organic material is applied in the region from which the defect has been removed, by lowering the transfer pin through the solution container tube to the region from which the defect has been removed, and when the solution of organic material is applied in the region from which the defect has been removed, the transfer pin does not come in direct contact with the organic layer.

[6] The manufacturing method according to [5], wherein a tip of the transfer pin is planar.

[7] The manufacturing method according to any one of [1] to [6], wherein the depression is a groove.

[8] The manufacturing method according to any one of [1] to [6], wherein the depression is a hole.

[9] The manufacturing method according to any one of [1] to [6], wherein the protrusion is a partition wall formed around the region from which the defect has been removed.

Advantageous Effects of Invention

With the manufacturing method of the present invention, depressions or protrusions are formed around an ablated portion of an organic layer, the ablated portion being formed by removing a defect of the organic layer, making it possible to prevent overflow of the solution applied in the ablated portion. This enables defect repair by reproducing an organic layer of appropriate thickness only in the ablated portion, and thus enables high-yield manufacturing of an organic EL display with less brightness variation.

DESCRIPTION OF EMBODIMENTS

Figure 1A:
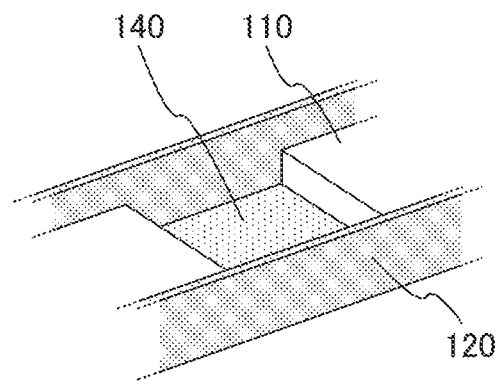
FIGS. 1A and 1B illustrate a conventional defect repair method.
Figure 1B:
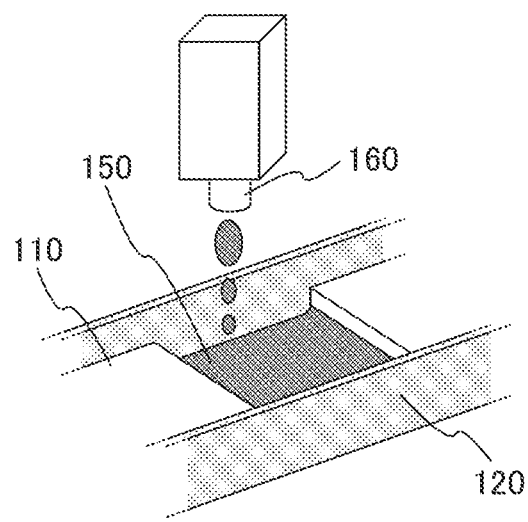
Figure 2A:
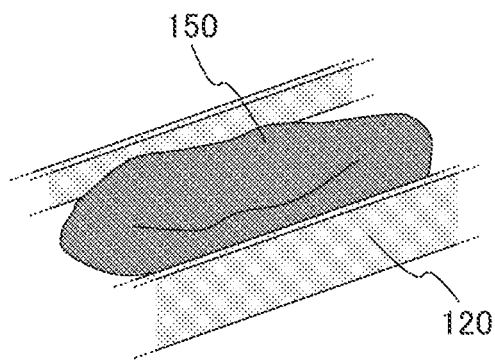
FIGS. 2A and 2B illustrate a conventional defect repair method.
Figure 2B:
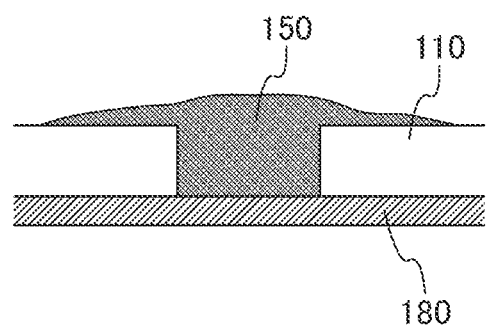

The present invention relates to a method of manufacturing an organic EL display. An organic EL display manufactured by the manufacturing method of the present invention includes at least a substrate and organic EL devices disposed on the substrate in a matrix arrangement. Each organic EL device includes at least a pixel electrode disposed over the substrate; an organic layer disposed over the pixel electrode; and a counter electrode disposed over the organic layer. The organic layer includes at least an organic light-emitting layer, but may include additional layers such as a hole injection layer, a hole transport layer, and/or an electron transport layer. The organic EL device may include optional members such as a color filter and/or a sealing film.

The method of the present invention for manufacturing an organic EL display includes: 1) a first step of forming on a substrate banks for defining an organic layer; 2) a second step of applying a solution of organic material in a region defined by the banks formed in the first step, to form an organic layer therein; 3) a third step of detecting a defect of the organic layer formed in the second step; 4) a fourth step of removing the defect detected in the third step; 5) a fifth step of forming depressions or protrusions around the region of the organic layer from which the defect has been removed (ablated portion); and 6) a sixth step of applying the solution of organic material in the ablated portion (region from which the defect has been removed) around which the depressions or protrusions have been formed in the fifth step.

In the first step, banks for defining an organic layer are formed on a substrate. The expression "banks are formed on a substrate" as used herein encompasses not only the formation of banks directly on a substrate, but also the formation of banks on a different member (e.g., pixel electrode) formed on a substrate.

There are no particular limitations on the type of the substrate as long as it is electrically insulating and has desired transparency and mechanical properties. In general, for example, a glass plate is often employed. The substrate may be subjected to surface treatment such as plasma treatment or UV treatment. The size and shape of the organic EL devices defined by banks or the like may be determined as desired according to the desired characteristics (e.g., resolution of the display).

The banks may define a separate organic layer for each organic EL device, or may define a compartment that includes a plurality of organic EL devices arranged in a row. The organic EL devices arranged in a row in a compartment emit light of the same color (red, green or blue).

There are no particular limitations on the bank material; however, for example, acrylic resin, polyimide resin, or novolac phenol resin is preferable in view of their insulation property, resistance to organic solvents, and resistance to treatments (plasma treatment, etching treatment, and baking treatment). The bank material may be fluorine resin (e.g., acrylic fluorine resin or polyimide-based fluorine resin). The bank may be subjected to surface treatment such as plasma treatment and/or UV treatment, whereby lyophilicity or lyophobicity of the bank' surface may be adjusted.

In the second step, a solution of organic material is applied in a region defined by the banks formed in the first step, to form an organic layer therein.

There are no particular limitations on the method of forming an organic layer as long as coating methods are employed. Examples of coating methods include inkjet printing, dispensing, and needle coating.

The types of organic material and solvent to be applied in a region defined by the banks may be determined as desired according to the type or desired characteristics of an organic layer to be produced. Examples of organic materials for constituting light-emitting layers include polyfluorene-based polymer organic materials.

The organic EL device is manufactured by laminating thin films of electrode and organic layer. Each thin film is controlled to have a thickness of the order of several tens of nanometers. Even when the manufacturing environment is strictly managed and manufacturing equipment is fully maintained, appropriate application of a solution of organic material may fail, and/or foreign material may be incorporated into the organic layer. In such cases, a defect is formed in the organic layer.

Figure 3A:
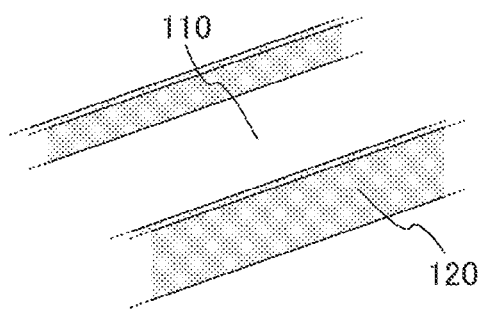
FIG. 3A is a perspective view illustrating a normal organic layer.
Figure 3B:
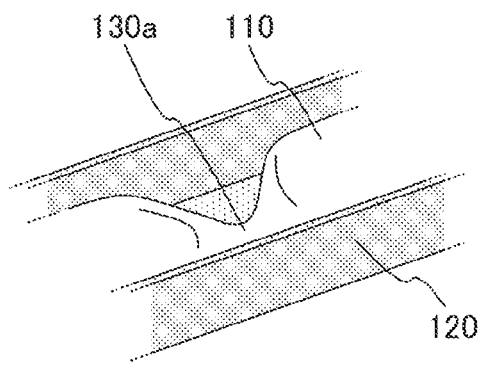
FIG. 3B is a perspective view illustrating a concave defect.
Figure 3C:
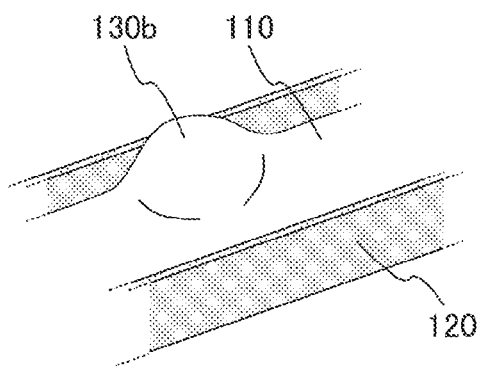
FIG. 3C is a perspective view illustrating a convex defect.
Figure 3D:
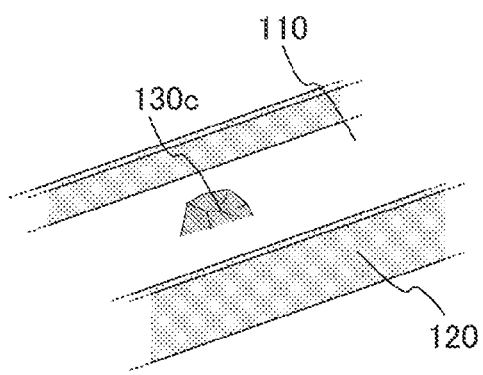
FIG. 3D is a perspective view illustrating a defect as a region contaminated with foreign material.

FIGS. 3A to 3D illustrate an organic layer formed in a region defined by banks. These drawings illustrate examples in which a linear organic layer is formed in a region defined by banks. FIG. 3A is a perspective view of a normal organic layer. As illustrated in this drawing, generally, organic layer 110 having a uniform thickness is formed in a region defined by banks 120. FIG. 3B is a perspective view illustrating a concave defect, FIG. 3C is a perspective view illustrating a convex defect, and FIG. 3D is a perspective view illustrating a defect as a region contaminated with foreign material. Concave defect 130a occurs in cases where a less amount of solution of organic material has been applied than is necessary, or where the solution has been repelled by the coated surface due to abnormal lyophilicity or lyophobicity. Convex defect 130b occurs in cases where a larger amount of the solution has been applied than is necessary. Defect 130c occurs in cases where foreign material such as a particle has been incorporated into organic layer 110. The third to fifth steps described below are directed to a method of repairing such defects.

In the third step, the possible presence of a defect of the organic layer formed in the second step is detected.

There are no particular limitations on the defect detection method; examples include microscopic visual inspection, image inspection, and pattern inspection. Image inspection and pattern inspection includes the "die-to-die inspection mode" in which the images of adjacent dies are compared for detecting foreign material, and the "die-to-database inspection mode" in which dies are compared with corresponding design data for detecting foreign material. If any defect has been detected, the process then proceeds to the fourth and fifth for repairing the defect. On the other hand, when no defect has been detected, the process skips the fourth and fifth steps and proceeds to the next manufacturing process (e.g., formation of another organic layer or counter electrode).

In the fourth step, the defect detected in the third step is removed. An ablated portion is formed in the organic layer by removal of the defect.

There are no particular limitations on the defect removing method; however, laser ablation is preferable. This is because laser ablation can remove defects irrespective of their type (e.g., concave, convex, or foreign material type). The expression "laser beam is applied to a defect" as used herein means to focus a laser beam directly to or in the vicinity of a defect.

There are no particular limitations on the laser source to be employed; examples include flash lamp-pumped Nd:YAG laser. When an Nd:YAG laser is employed, the wavelength of the laser beam can be selected from 1,064 nm (fundamental), 532 nm (second harmonics), 355 nm (third harmonics), and 266 nm (fourth harmonics) wavelengths.

There are no particular limitations on the wavelength of a laser beam applied to a defect as long as the organic layer (defect) may absorb the radiation; it is preferably 1,100 nm or less, most preferably 400 nm or less. That is, when using an Nd:YAG laser, the third harmonics (355 nm) or fourth harmonics (266 nm) wavelength is preferable. This is because shorter wavelengths have a less effect on underlying layers disposed under the organic layer, such as a substrate, a pixel electrode and other organic layers (see Japanese Patent Application Laid-Open No. 2002-124380). The energy density of the laser beam applied to a defect may be appropriately determined depending on the material, thickness, etc. of the organic layer.

The laser irradiation area is preferably adjusted in accordance with the size and shape of the defect. The laser irradiation area may be adjusted by controlling the opening area of a slit.

Figure 4A:
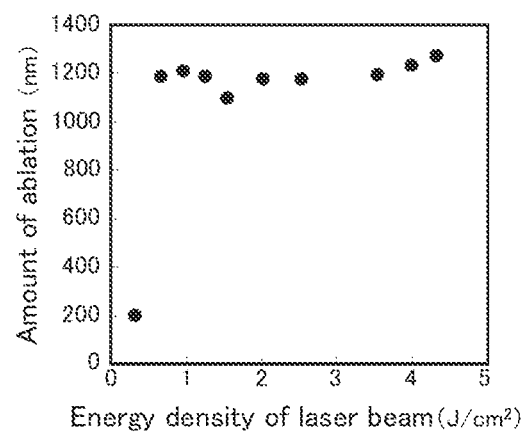
FIGS. 4A to 4C are a graph showing the relationship among laser wavelength, energy density, and the amount of ablated organic layer.
Figure 4B:
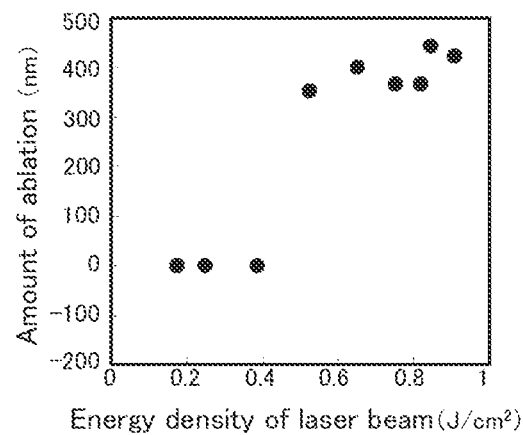
Figure 4C:
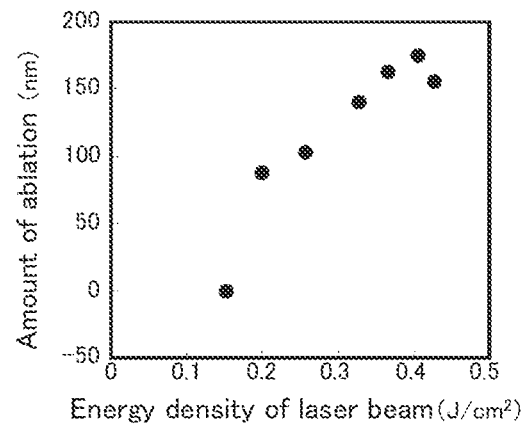

FIGS. 4A to 4C are a graph showing the results of preliminary experiments in which the relationship among laser wavelength, energy density, and the amount of ablated organic layer is investigated. In this experimentation, laser beams with three different wavelengths are applied at various energy densities to an organic light-emitting layer (polyfluorene-based polymer organic material; thickness: 140 nm) formed on a glass substrate. As a laser source, AGT-2000RT (YAG laser, AGT Corporation) is employed. The laser irradiation area on the surface of the organic light-emitting layer is set to 20 μm, and pulse width is set to 3 to 5 ns. Laser irradiation is done in a single shot.

FIG. 4A is a graph showing the relationship between laser energy density (0.42 to 4.5 J/cm$^2$) and amount (depth) of ablated organic layer for 1,064 nm wavelength. FIG. 4B is a graph showing the relationship between laser energy density (0.06 to 0.71 J/cm$^2$) and amount (depth) of ablated organic layer for 532 nm wavelength. FIG. 4C is a graph showing the relationship between laser energy density (0.05 to 0.41 J/cm$^2$) and amount (depth) of ablated organic layer for 355 nm wavelength. From these graphs, it can be seen that, with the 355 nm wavelength laser beam, it is possible to adjust the amount of ablated organic layer in the order of several tens of nanometers by controlling its energy density.

In the fifth step, depressions or protrusions are formed around the ablated portion of the organic layer formed in the fourth step. The depression or protrusion has a function of preventing, upon application of a solution of organic material in the ablated portion in the sixth step later described, the solution from overflowing out of the ablated portion. As used herein, the term "depression" means a groove (see Embodiments 1 and 3) or a hole (see Embodiment 2), and the term "protrusion" means a partition wall or the like formed around an ablated portion of an organic layer (see Embodiment 4).

The depressions or protrusions may be formed either on the bank or organic layer, but is preferably formed on the organic layer. There are no particular limitations on the method of forming the depressions or protrusions; however, formation by laser irradiation (laser ablation) is preferable. This is because laser ablation allows for formation of depressions or protrusions in desired shape. There are no particular limitations on the type of the laser source and laser beam wavelength; laser source and laser beam wavelength may be the same as those used in the fourth step (defect removal step).

The fifth step in which depressions or protrusions are formed may be conducted at the same time as, or after, the fourth step in which a defect is removed. That is, depressions or protrusions may be formed at the same time as, or after, the removal of a defect. When forming protrusions, the fourth and fifth steps can be conducted at the same time (see Embodiment 4).

In the sixth step, the solution of organic material is re-applied in the ablated portion of the organic layer (region from which a defect has been removed) around which depressions or protrusions have been formed in the fifth step, to reproduce an organic layer therein.

Application of the coating solution in the ablated portion may be accomplished by, for example, an inkjet printer, a dispenser, a coating needle or a fine droplet transfer device. These devices are capable of adjusting the amount of the coating solution according to the volume of the ablated portion. For example, since the amount of ablation depends on the intensity of laser beam (see FIGS. 4A to 4C), the volume of the ablated portion is determined by its area. The area of the ablated portion (e.g., length multiplied by width) can be readily determined based on laser irradiation conditions or by actual measurements. Thus, with the manufacturing method of the present invention, it is possible to readily specify the volume of an ablated portion based on its area or other parameter, whereby an optimal amount of coating solution can be applied for repairing a defect of the organic layer.

In the present invention, it is particularly preferable to use a fine droplet transfer device for applying a solution of organic material in an ablated portion. The fine droplet transfer device includes a solution container tube for containing therein a solution of organic material, and a transfer pin configured to be capable of passing through the solution container tube. Such a fine droplet transfer device is disclosed in, for example, Japanese Patent Application Laid-Open Nos. 2000-287670, 2001-46062, 2006-320795, and 2008-191091.

Application of a solution of organic material in an ablated portion using such a fine droplet transfer device may be accomplished by lowering the transfer tip through the filled solution container tube to the ablated portion. By lowering the transfer pin to the ablated portion, a droplet of the solution attached to the tip of the transfer pin is applied in the ablated portion. The tip of the transfer pin is preferably planar so that the solution can be easily attached thereto (see FIG. 7A). Since the fine droplet transfer device is suitable for applying trace amounts of liquid, by using this device, it is possible to precisely apply a required amount of coating solution in the ablated portion.

Figure 7A:
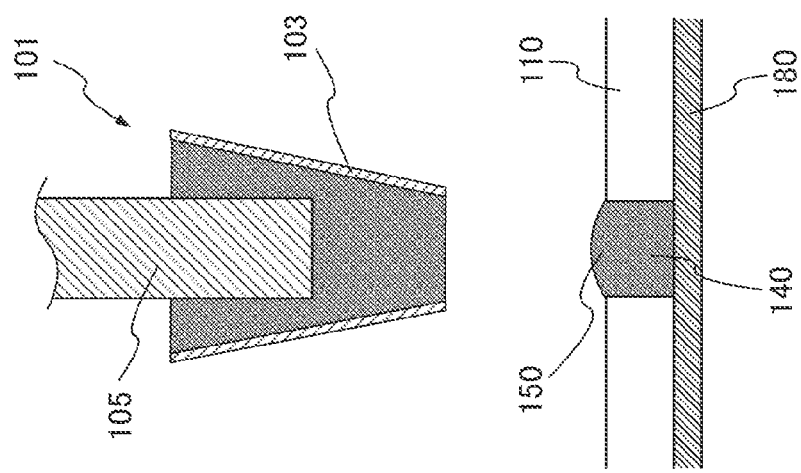
FIGS. 7A to 7C illustrate that a solution of organic material is applied in an ablated portion of an organic layer according to Embodiment 1.
Figure 7B:
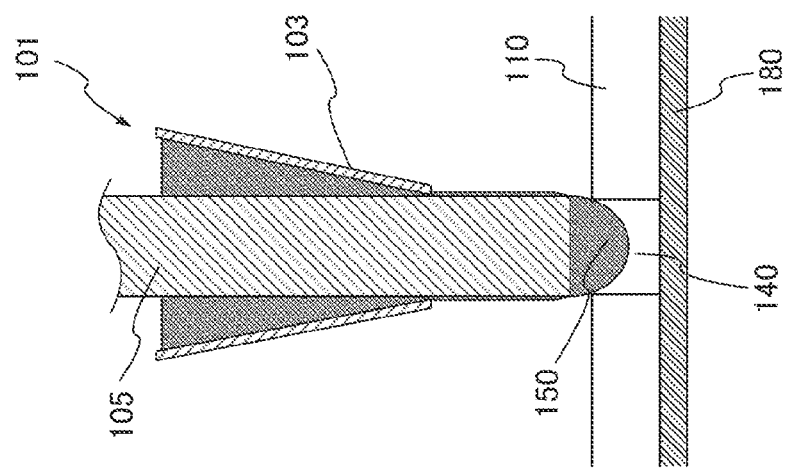

Preferably, the transfer pin does not come in direct contact with the organic layer when it is lowered through the solution container tube to the ablated portion (see FIG. 7B). The reason for this is that when the transfer pin comes in direct contact with the organic layer, there is concern that the droplet attached to the tip of the transfer pin is flattened and spreads over other areas than the ablated portion. Technologies that may be employed to avoid possible contact of the transfer pin with the organic layer are disclosed by, for example, Japanese Patent Application Laid-Open Nos. 2000-287670 and 2008-191091.

In general, the solvent used in the coating solution to be applied in the ablated portion is the same as that of the coating solution used in the second step. The concentration of organic material in the coating solution may be the same or higher than that of the solution used in the second step. By increasing the organic material's concentration, it is possible to form an adequately thick organic layer in the ablated portion even with a lesser amount of coating solution.

As described above, since depressions or protrusions are formed around an ablated portion of an organic layer, when the solution of organic material is re-applied in the ablated portion, the depressions or protrusions prevent the solution from spreading over other areas than the ablated portion. Thus, local repair of defective organic layer is made possible by applying the solution of organic material only in the ablated portion. By forming depressions or protrusions around the ablated portion in this way, it is possible to increase product quality and manufacturing yields.

Thus, with the manufacturing method of the present invention, by forming depressions or protrusions around the ablated portion of an organic layer, it is possible to repair the defect by reproducing an organic layer of appropriate thickness without affecting surrounding normal areas of the organic layer.

Hereinafter, with reference to the drawings, embodiments of the manufacturing method of the present invention will be described, which however shall not be construed as limiting the scope of the invention thereto.

(Embodiment 1)

Embodiment 1 describes an example in which a defect of an organic layer is ablated, slit-like grooves are formed in the organic layer around the ablated portion, and an organic layer is reproduced in the ablated portion to repair the defect.

The manufacturing method according to Embodiment 1 includes: 1) a first step of forming banks; 2) a second step of forming an organic layer; 3) a third step of detecting a defect; 4) a fourth step of removing the defect; 5) a fifth step of forming grooves; and 6) a sixth step of applying a solution of organic material in the ablated portion.

In the first step, linear banks for defining an organic layer are formed on a substrate. In the next second step, by inkjet printing, a solution of organic material is applied in the region defined by the banks formed in the first step, to form an organic layer therein (see FIG. 1A). In the third step, a possible defect of the organic layer is detected using a pattern inspection device or the like. The following description is based on the assumption that a defect has been detected (see FIGS. 3B to 3D).

Figure 5A:
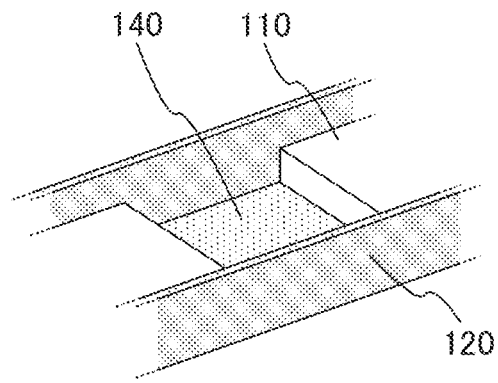
FIGS. 5A and 5B are a perspective view illustrating an ablated portion of an organic layer.
Figure 5B:
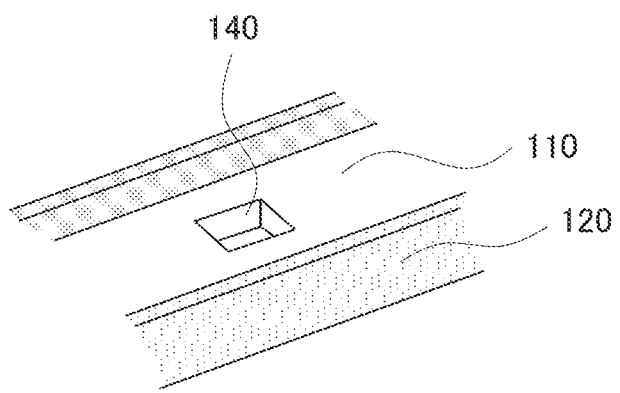

In the fourth step, a laser beam is applied to the defect detected in the third step, ablating the defect to form an ablated portion 140 in the organic layer (see FIGS. 5A and 5B). Ablated portion 140 may or may not laterally extend as far as banks 120, as illustrated in FIGS. 5A and 5B, respectively.

In the fifth step, a laser beam is applied to the organic layer around the region from which the defect has been removed (ablated portion), to form slit-like grooves. More specifically, a laser beam is applied over the organic layer multiple times in a slit pattern. There are no particular limitations on the shape (length, width and depth) and the number of slits to be formed; they can be appropriately determined based on the property (e.g., viscosity) of the solution applied in the sixth step.

Figure 6A:
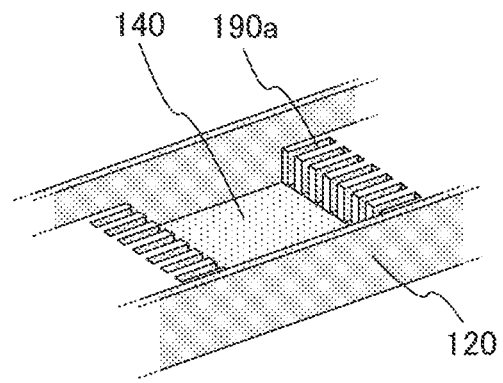
FIGS. 6A and 6B are a perspective view illustrating an ablated portion of an organic layer according to Embodiment 1.
Figure 6B:
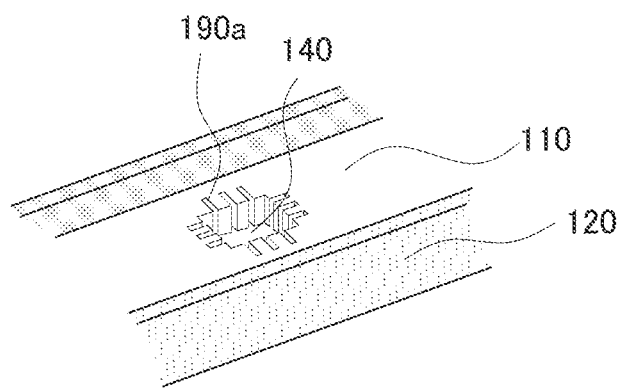

FIGS. 6A and 6B are a perspective view illustrating ablated portion 140 around which slit-like grooves 190a are formed. As illustrated in FIGS. 6A and 6B, a plurality of slit-like grooves 190a that run in parallel to the longitudinal axis of banks 120 is formed around ablated portion 140. Slit-like grooves 190a may or may not be opened (connected) to ablated portion 140.

Figure 7C:
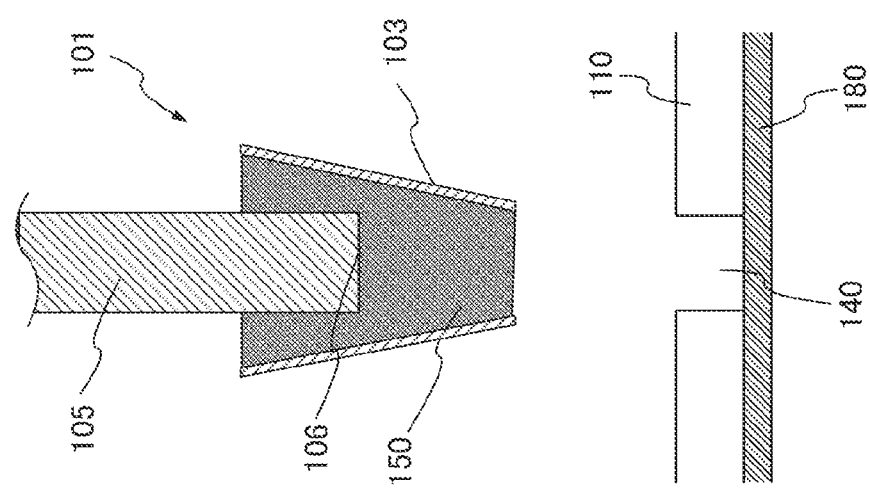

In the sixth step, using a fine droplet transfer device, the solution of organic material is re-applied in the ablated portion to reproduce an organic layer therein (see FIGS. 7A to 7C).

As illustrated in FIG. 7A, fine droplet transfer device 101 includes solution container tube 103 for containing therein solution 150 of organic material, and transfer pin 105 configured to be capable of passing through solution container tube 103. Solution container tube 103 is, for example, a glass tube, and transfer pin 105 is, for example, a pin made of tungsten. Tip 106 of transfer pin 105 is planar.

Application of solution 150 in ablated portion 140 by means of such fine droplet transfer device 101 may be accomplished by lowering transfer pin 105 through solution container tube 103 to ablated portion 140, as illustrated in FIG. 7B. When transfer pin 105 is lowered to ablated portion 140 through solution container tube 103, solution 150 attached to the tip of transfer pin 105 is applied in ablated portion 140. At this point, only solution 150 attached to the tip of transfer pin 105 is allowed to come direct contact with organic layer 110; transfer pin 105 itself is not allowed to come direct contact with organic layer 110. With this configuration, as illustrated in FIG. 7C, solution 150 is precisely applied only in ablated portion 140 without being attached to the surrounding areas of ablated portion 140.

As described above, in this embodiment, grooves 190a are formed around ablated portion 140. Thus, even when an excess amount of solution 150 has been applied in ablated portion 140, the solution is accommodated in grooves 190a and thus never spreads to the surrounding areas of ablated portion 140.

Thus, the manufacturing method according to Embodiment 1 is characterized in that a defect of an organic layer is ablated, and then slit-like grooves are formed in the organic layer around the ablated portion. Local defect repair is thereby made possible.

(Embodiment 2)

Embodiment 1 describes an example in which slit-like grooves are formed around the ablated portion of an organic layer. Embodiment 2 describes an example in which holes are formed in the organic layer around the ablated portion.

Similarly to the manufacturing method according to Embodiment 1, the manufacturing method according to Embodiment 2 includes: 1) a first step of forming banks; 2) a second step of forming an organic layer; 3) a third step of detecting a defect; 4) a fourth step of removing the defect; 5) a fifth step of forming holes; and 6) a sixth step of applying a solution of organic material in the ablated portion. Since the steps other than the fifth step are the same as those in Embodiment 1, only the fifth step is described herein.

In the fifth step, a plurality of holes is formed in the organic layer around the ablated portion. More specifically, a laser beam is applied over the organic layer multiple times in a desired hole pattern (e.g., circular or square holes). There are no particular limitations on the shape (e.g., length, width, diameter, and depth) and the number of holes to be formed; they can be appropriately determined according to the property (e.g., viscosity) of the coating solution applied in the sixth step.

Figure 8A:
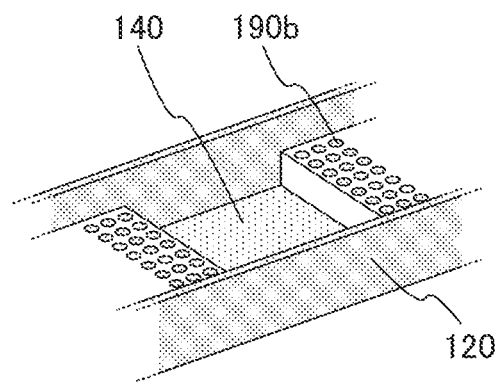
FIGS. 8A and 8B are a perspective view illustrating an ablated portion of an organic layer according to Embodiment 2.
Figure 8B:
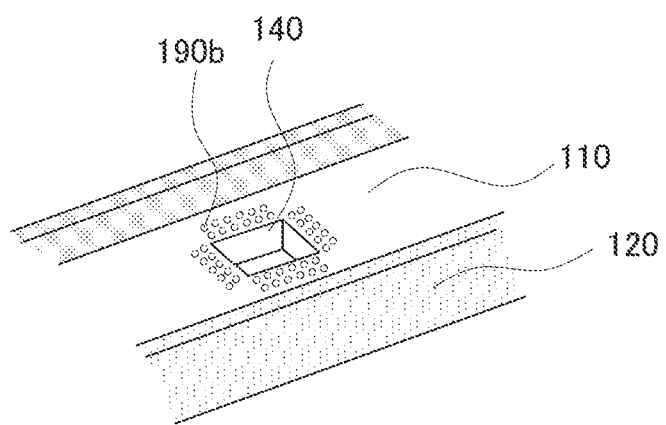

FIGS. 8A and 8B are a perspective view illustrating an ablated portion around which a plurality of holes is formed. As illustrated in FIGS. 8A and 8B, a plurality of holes 190b is formed around ablated portion 140. Thus, even when an excess amount of solution 150 has been applied in ablated portion 140 in the sixth step, the solution is accommodated in grooves 190b and thus never spreads to the surrounding areas of ablated portion 140.

Thus, the manufacturing method according to Embodiment 2 is characterized in that a defect of an organic layer is ablated, and then holes are formed in the organic layer around the ablated portion. In this way local defect repair is made possible as with the manufacturing method according to Embodiment 1.

(Embodiment 3)

Embodiment 1 describes an example in which slit-like grooves that run in parallel to the longitudinal axis of linear banks are formed. Embodiment 3 describes an example in which slit-like grooves that run perpendicularly to the longitudinal axis of linear banks are formed.

Similarly to the manufacturing method according to Embodiment 1, the manufacturing method according to Embodiment 3 includes: 1) a first step of forming banks; 2) a second step of forming an organic layer; 3) a third step of detecting a defect; 4) a fourth step of removing the defect; 5) a fifth step of forming grooves; and 6) a sixth step of applying a solution of organic material in the ablated portion. Since the steps other than the fifth step are the same as those in Embodiment 1, only the fifth step is described herein.

In the fifth step, in the organic layer, slit-like grooves are formed that run along the sides of the ablated portion. More specifically, a laser beam is applied over the organic layer multiple times in a slit pattern. There are no particular limitations on the shape (e.g., length, width, diameter, and depth) and the number of holes to be formed; they can be appropriately determined according to the property (e.g., viscosity) of the coating solution applied in the sixth step.

Figure 9A:
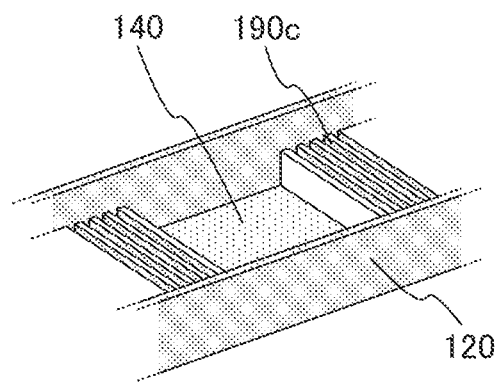
FIGS. 9A and 9B are a perspective view illustrating an ablated portion of an organic layer according to Embodiment 3.
Figure 9B:
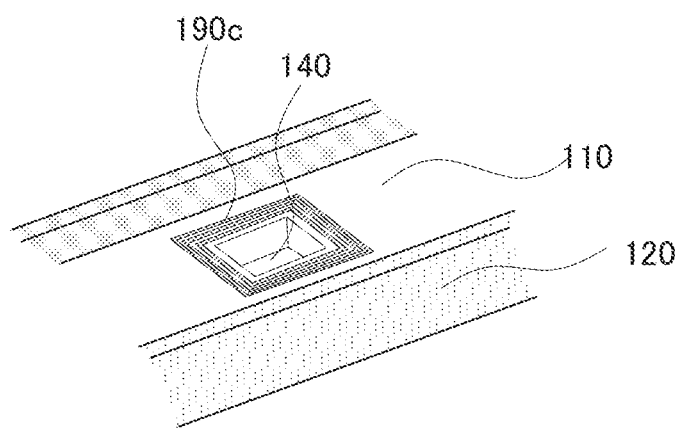

FIGS. 9A and 9B are a perspective view illustrating an ablated portion around which slit-like grooves are formed that run along the sides of the ablated portion. As illustrated in FIGS. 9A and 9B, around ablated portion 140, slit-like grooves 190c are formed that run along the sides of ablated portion 140. Thus, even when an excess amount of solution 150 has been applied in ablated portion 140 in the sixth step, the solution is accommodated in grooves 190c and thus never spreads to the surrounding areas of ablated portion 140.

Thus, the manufacturing method according to Embodiment 3 is characterized in that a defect of an organic layer is ablated, and then slit-like grooves are formed in the organic layer around the ablated portion. In this way local defect repair is made possible as with the manufacturing method according to Embodiment 1.

(Embodiment 4)

Embodiments 1 to 3 describe examples in which depressions are formed around the ablated portion of an organic layer. Embodiment 4 describes an example in which partition walls (protrusions) are formed around the ablated portion of an organic layer.

The manufacturing method according to Embodiment 4 includes: 1) a first step of forming banks; 2) a second step of forming an organic layer; 3) a third step of detecting a defect; 4) a fourth step of removing the defect; 5) a fifth step of forming partition walls; and 6) a sixth step of applying a solution of organic material in the ablated portion. Since the steps other than the fifth step are the same as those in Embodiment 1, only the fifth step is described herein.

In the fifth step, partition walls are formed around an ablated portion of an organic layer. Formation of partition walls on the organic layer around the ablated portion may be accomplished by adjusting the intensity of the laser beam to be applied in the fourth step. More specifically, the intensity of the laser beam in the fourth step may be set to 0.1 to 0.2 J/cm². Application of a laser beam having an intensity of 0.1 to 0.2 J/cm² results in the simultaneous formation of an ablated portion and partition walls around the ablated portion. Thus, the fourth and fifth steps in this embodiment are conducted at the same time. On the other hand, when the laser intensity exceeds 0.2 J/cm², there is concern that formation of partition walls may fail. When the laser intensity is less than 0.1 J/cm², on the other hand, there is concern that removal of a defect may fail.

Figure 10A:
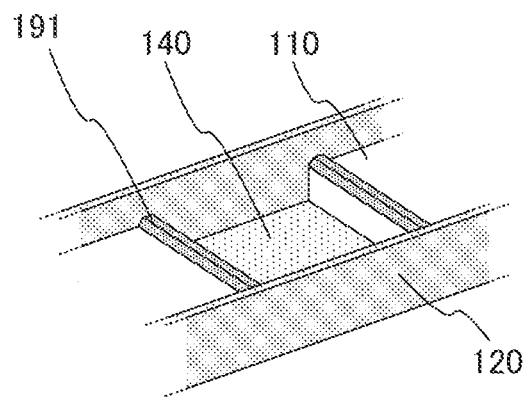
FIGS. 10A and 10B are a perspective view illustrating an ablated portion of an organic layer according to Embodiment 4.
Figure 10B:
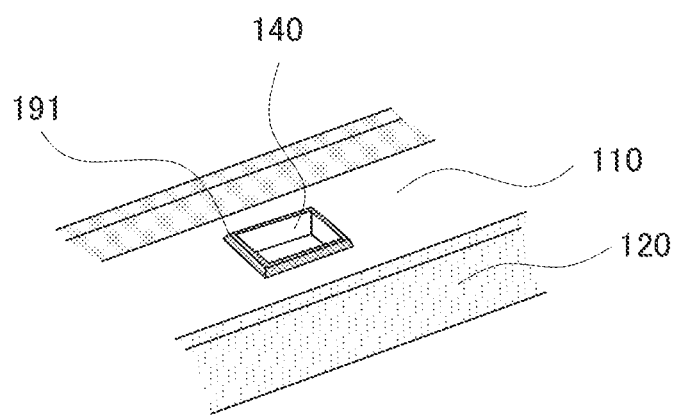

FIGS. 10A and 10B are a perspective view illustrating an ablated portion around which partition walls are formed. As illustrated in FIGS. 10A and 10B, partition walls 191 are formed on organic layer 110 around ablated portion 140. The height of partition walls 191 is generally 20 to 80 nm. Partition walls 191 have a function of retaining the coating solution applied in the ablated portion 140. Thus, even when an excess amount of solution 150 has been applied in ablated portion 140 in the sixth step, the solution is retained by partition walls 191 and never spreads to the surrounding areas of ablated portion 140.

Thus, the manufacturing method according to Embodiment 4 is characterized in that a defect of an organic layer is ablated, and then partition walls are formed around the ablated portion. In this way a defect of an organic layer can be properly repaired as with the manufacturing method according to Embodiment 1.

This application is entitled and claims the priority of Japanese Patent Application No. 2009-028436 filed on Feb. 10, 2009, the disclosure of which including the specification, drawings and abstract is incorporated herein by reference in its entirety.

INDUSTRIAL APPLICABILITY

The manufacturing method of the present invention can repair a defect of an organic layer without affecting other areas than the defect and, therefore, is useful for improving product quality and manufacturing yields of organic EL displays.

The manufacturing method of the present invention can be applied to various pattern formation methods.

REFERENCE SIGNS LIST

101 Fine Droplet Transfer Device
103 Solution Container Tube
105 Transfer Pin
106 Tip of Transfer Pin
110 Organic layer
120 Bank
130 Defect
140 Ablated Portion of Organic Layer
150 Solution of Organic Material
160 Inkjet Head Nozzle
180 Substrate
190a, 190c Groove
190b Hole
191 Partition wall

The invention claimed is:

1. A method of repairing a defect of an organic EL display, the organic EL display including a substrate and a plurality of organic EL devices disposed on the substrate in a matrix pattern, the method comprising:
   forming, on the substrate, banks for defining an organic layer;
   applying a solution of organic material in a region defined by the banks, to form the organic layer;
   detecting a defect of the organic layer;
   removing the defect;
   forming, in the organic layer, a depression horizontally adjacent to a space formed by removing the defect or a protrusion on a part of the organic layer, the part being horizontally adjacent to the space, the depression being composed of a plurality of grooves or holes in the organic layer and not opened to the space, the protrusion being a partition wall around the region; and
   reapplying the solution of organic material in the region from which the defect has been removed.

2. The method according to claim 1, wherein the defect is removed by laser irradiation.

3. The method according to claim 1, wherein an inkjet printer, a dispenser or a coating needle is used to reapply the solution of organic material in the space.

4. The method according to claim 1, wherein a fine droplet transfer device is used to reapply the solution of organic material in the space.

5. The method according to claim 4, wherein the fine droplet transfer device includes a solution container tube for containing therein the solution of organic material, and a transfer pin configured to be capable of passing through the solution container tube,
   the solution of organic material is applied in the space, by lowering the transfer pin through the solution container tube to the space, and
   when the solution of organic material is applied in the space, the transfer pin does not come in direct contact with the organic layer.

6. The method according to claim 5, wherein a tip of the transfer pin is planar.

7. The method according to claim 1, wherein the depression is a groove.

8. The method according to claim 1, wherein the depression is a hole.

9. The method according to claim 1, wherein:
   the defect is removed by a laser irradiation, and
   the depression or the protrusion is formed by a laser irradiation after the laser irradiation for removing the defect.

10. The method according to claim 1, wherein:
    the defect is removed by a laser irradiation, and
    the depression or the protrusion is formed by the laser irradiation simultaneously with removing the defect.

11. The method according to claim 2, wherein: an intensity of a laser beam of the laser irradiation is 0.1 to 0.2 $J/cm^2$.

* * * * *